United States Patent

Mravic et al.

[11] Patent Number: 6,083,840
[45] Date of Patent: Jul. 4, 2000

[54] SLURRY COMPOSITIONS AND METHOD FOR THE CHEMICAL-MECHANICAL POLISHING OF COPPER AND COPPER ALLOYS

[75] Inventors: Brian Mravic, deceased, late of New Haven, by Judith A. Mravic, legal representative; Anthony Mark Pasqualoni, Hamden; Deepak Mahulikar, Madison, all of Conn.

[73] Assignee: Arch Specialty Chemicals, Inc., Norwalk, Conn.

[21] Appl. No.: 09/200,518

[22] Filed: Nov. 25, 1998

Related U.S. Application Data

[60] Provisional application No. 60/077,071, Mar. 6, 1998.

[51] Int. Cl.[7] .................................................. H01L 21/00
[52] U.S. Cl. ........................ 438/693; 216/89; 252/79.4; 252/79.1; 438/754; 438/745
[58] Field of Search .................................... 438/691, 692, 438/693, 745, 754; 252/79.1, 79.2, 79.4; 106/3; 216/18, 38, 88, 89

[56] References Cited

U.S. PATENT DOCUMENTS

| | | |
|---|---|---|
| Re. 35,570 | 7/1997 | Rowenhorst et al. . |
| 3,951,710 | 4/1976 | Basi . |
| 4,332,649 | 6/1982 | Salzle . |
| 4,549,374 | 10/1985 | Basi et al. . |
| 4,954,142 | 9/1990 | Carr et al. . |
| 4,959,113 | 9/1990 | Roberts . |
| 4,968,381 | 11/1990 | Prigge et al. . |
| 4,992,135 | 2/1991 | Doan . |
| 5,084,071 | 1/1992 | Nenadic . |
| 5,157,876 | 10/1992 | Medellin . |
| 5,209,816 | 5/1993 | Yu et al. . |
| 5,225,034 | 7/1993 | Yu et al. . |
| 5,366,523 | 11/1994 | Rowenhorst et al. . |
| 5,391,258 | 2/1995 | Brancaleoni et al. . |
| 5,476,606 | 12/1995 | Brancaleoni et al. . |
| 5,858,813 | 1/1999 | Scherber et al. ................. 438/693 |
| 5,897,375 | 4/1999 | Watts et al. ...................... 438/693 |

OTHER PUBLICATIONS

"Chemical–Mechanical Polishing of Copper With Oxide And Polymer Interlevel Dielectrics" Ronald J. Gutmann, et al Thin Solid Films 270 (1995) pp. 596–600.

"Initial Study On Copper CMP Slurry Chemistries" R. Carpio, et al Thin Solid Films 266 (1995) pp. 238–244.

"Characterization of Cu Chemical Mechanical Polishing By Electrochemical Investigations" D. Zeidler, et al Microelectric Engineering 33 (1997) pp. 259–268.

"Stabilization Of Alumina Slurry For Chemical–Mechanical Polishing Of Copper" Q. Luo, et al Langmuir 12 (1996) pp. 3563–3566.

"Mechanism Of Copper Removal During Chemical Mechanical Polishing In Alkaline Media" Q. Luo, et al. VMIC Conference Jun. 10–12, 1997 ISMIC–107/97/0287 (c) pp. 287–292.

(List continued on next page.)

*Primary Examiner*—William Powell
*Attorney, Agent, or Firm*—Ohlandt, Greeley, Ruggiero & Perle, L.L.P.

[57] ABSTRACT

The present invention relates to an improved chemical-mechanical polishing (CMP) method for polishing a copper coated wafer containing a copper adhesion-promoting layer and a silicon-based layer. The method polishes copper layers with high removal rates, low defect densities and reduced amounts of dishing and erosion. The method involves a two step process. The first step is to utilize a bulk copper removal slurry that rapidly removes the majority the copper on the substrate. The second step utilizes a 1:1:1 selectivity copper/tantalum/silicon dioxide ($Cu/Ta/SiO_2$) slurry that has approximately the same polishing rates for the copper layer, the adhesion-promoting layer and the silicon-based substrate. The second slurry reduces the amount of dishing and erosion that occurs in the copper trenches and dense copper arrays.

28 Claims, 2 Drawing Sheets

OTHER PUBLICATIONS

"Key Process And Slurry Factors For W CMP For Deep Submicron Device Fabrication" Gautam Grover, et al VMIC Conference Jun. 10–12, 1997 ISMIC–107/97/0293 (c) pp. 293–298.

"Mechanistic Studies Of Al CMP And Development Of Novel Slurries" Ashwani K. Rawat, et al VMIC Conference Jun. 10–12, 1997 ISMIC–107/97/0321 (C) p. 321.

"Modeling And Process Optimization For Selective CMP" Eric Tseng Eric Tseng, et al VMIC Conference Jun. 10–12, 1997 ISMIC–107/97/03601 (C) pp. 360–362.

"Chemical–Mechanical Polishing Of Copper For Intercinnect Formation" Z. Stavreva, et al Microelectronic Engineering 33 (1997) pp. 249–257.

"Chemical–Mechanical Polishing Of Copper Thin Films" By Joseph M. Steigerwald A Thesis Submitted to the Graduate Faculty of Rensselaer Polytechnic Institute.

"Chemical–Mechanical Polishing Of Copper In Glycerol Based Slurries" K.S. Kumar, et al. Material Research Society Symposium Proceedings 1996.

SLURRY COMPOSITIONS AND METHOD FOR THE CHEMICAL-MECHANICAL POLISHING OF COPPER AND COPPER ALLOYS

This application is a conversion of U.S. Provisional Application Ser. No. 60/077,071, filed on Mar. 6, 1998, and 60/066,800 (Our Docket No. 341.5925.USP, filed on Nov. 26, 1997, entitled "Chemical-Mechanical Polishing of Copper and Copper Alloys by Mravic et.

This invention relates generally to the chemical-mechanical polishing (CMP) of copper coated substrates (e.g., semiconductors) and slurry compositions therefor. In particular, the present invention relates to a two step process to a two step process utilizing a copper removal slurry followed by a copper/tantalum/silicon dioxide slurry.

BACKGROUND OF THE INVENTION

Silicon based semiconductor devices, such as integrated circuits, typically include a silicon dioxide ($SiO_2$) dielectric layer. Multilevel circuit traces, typically formed from aluminum or an aluminum alloy, are patterned onto the $Sio_2$ substrate.

If the aluminum based circuit traces are replaced with copper based circuit traces, the density of circuit traces on the face of the device could be increased because copper has a higher electrical conductivity than aluminum enabling the use of circuit traces with a reduced cross-sectional area. In addition, the electromigration of copper is approximately 0.1 that of aluminum at a given temperature.

In order to use multilevel metals circuit traces, lithographic focus constraints require that the substrate surface be planar on both a global and local scale. If the surface is not planar, the exposure tool can not be focused properly resulting in out of focus images and poor quality printing.

One way to fabricate planar copper circuit traces on a silicon dioxide substrate is referred to as the damascene process. In accordance with this process, the silicon dioxide dielectric surface is patterned by a conventional dry etch process to form holes and trenches for vertical and horizontal interconnects. The patterned surface is coated with an adhesion-promoting layer such as titanium or tantalum and/or a diffusion barrier layer such as titanium nitride or tantalum nitride. The adhesion-promoting layer and/or the diffusion barrier layer is then overcoated with copper. Chemical-mechanical polishing is next employed to reduce the thickness of the copper overlayer, as well as the thicknesses of any adhesion-promoting layer and/or diffusion barrier layer, until a planar surface that exposes elevated portions of the silicon dioxide surface is obtained. The vias and trenches remain filled with electrically conductive copper forming the circuit interconnects.

Previously, it was believed that the removal rate of the copper and the adhesion-promoting layer and/or the diffusion barrier layer must both greatly exceed the removal rate of silicon dioxide so that polishing effectively stops when elevated portions of the silicon dioxide are exposed. The ratio of the removal rate of copper to the removal rate of silicon dioxide base is called "selectivity." A minimum selectivity of about 50 was desired for chemical-mechanical polishing. However, when high selectivity copper slurries are used, the copper layers are easily over-polished creating a depression or "dishing" effect in the copper vias and trenches. This feature distortion is unacceptable due to lithographic and other constraints in semiconductor manufacturing.

Another feature distortion that is unsuitable for semiconductor manufacturing is called "erosion". Erosion is the topography difference between a field of silicon oxide and a dense array of copper vias or trenches. In chemical-mechanical polishing, the materials in the dense array are removed or eroded at a faster rate than the surrounding field of silicon oxide. This causes a topography difference between the field of silicon oxide and the dense copper array. The industry standard for erosion is typically less than 500 Angstroms (Å).

Chemical-mechanical polishing has two components, a chemical component and a mechanical component. An important consideration in slurry selection is "passive etch rate." The passive etch rate is the rate at which copper is dissolved by the chemical component alone and should be significantly lower than the removal rate when both the chemical component and the mechanical component are involved to prevent under-cutting of copper contained in the trenches and vias by contact with the chemical component. A large passive etch rate leads to dishing and thus, preferably, it is less than 10 nanometers per minute.

A number of systems for chemical-mechanical polishing of copper have been disclosed. Kumar et al. in an article entitled "Chemical-Mechanical Polishing of Copper in Glycerol Based Slurries" (*Materials Research Society Symposium Proceedings,* 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films,* 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir,* 1996) discloses alumina-ferric nitrate slurries that contain polymeric surfactants and BTA. Carpio et al. in an article entitled "Initial Study on Copper CMP Slurry Chemistries" (*Thin Solid Films,* 1995) disclose slurries that contain either alumina or silica particles, nitric acid or ammonium hydroxide, with hydrogen peroxide or potassium permanganate as an oxidizer.

There are a number of theories as to the mechanism for chemical-mechanical polishing of copper. An article by Zeidler et al. (*Microelectronic Engineering,* 1997) proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

While present day chemical-mechanical polishing systems are capable of removing a copper overlayer from a silicon dioxide substrate, the systems do not satisfy the rigorous demands of the semiconductor industry. These requirements can be summarized as follows. First, there is a need for high removal rates of copper to satisfy throughput demands. Secondly, there must be excellent topography uniformity across the substrate. Finally, the CMP method must minimize local dishing and erosion effects to satisfy ever increasing lithographic demands.

Accordingly it is an object of the present invention to provide slurries that rapidly remove copper. It is also an object of the present invention to provide a slurry that will reduce the amount of dishing in copper vias and trenches. It is a further object of the present invention to provide a method that will rapidly polish copper layers without causing dishing and erosion effects.

SUMMARY OF THE INVENTION

The present invention relates to a method of polishing copper layers with high removal rates, low defect densities and reduced amounts of dishing and erosion. The method involves a two step process. The first step is to utilize a bulk copper removal slurry that rapidly removes the majority of the copper on the substrate with low defect densities. The second step utilizes a 1:1:1 selectivity copper/tantalum/silicon dioxide ($Cu/Ta/SiO_2$) slurry that has approximately the same polishing rates for the copper layer, the adhesion-promoting layer and the silicon-based substrate. This slurry reduces the amount of dishing and erosion that occurs in the copper trenches and dense copper arrays.

In accordance with the invention, there is provided a bulk copper slurry for polishing a substrate. The slurry includes an abrasive phase and a liquid activator phase. The abrasive phase comprises abrasive particles that have a mean particle diameter of from about 10 nanometers to about 800 nanometers. The liquid activator phase, that contacts the abrasive phase, is an aqueous solution that includes a mixture of a carboxylic acid and an oxidizer. The bulk copper polishing slurry is capable of removing the copper at a rate larger than 3000 Å/min.

In addition, this invention also provides a $Cu/Ta/SiO_2$ slurry that has approximately equal polishing rates between the three layers. This slurry also includes an abrasive phase and a liquid activator phase. The abrasive phase includes abrasive particles that have a mean particle diameter of from about 10 nanometers to about 800 nanometers. The liquid activator phase, that contacts the abrasive phase, is an aqueous solution that includes a mixture of an acid and an oxidizer.

The above stated objects, features and advantages will become more apparent from the specification and drawings that follow.

DETAILED DESCRIPTION OF THE PREFERRED EMBODIMENT

Figure 1:
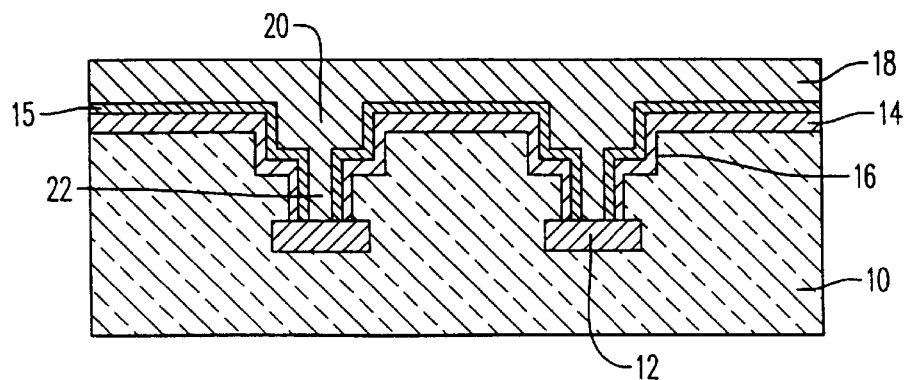
FIG. 1 illustrates in cross-sectional representation a silicon dioxide based substrate having a copper overlayer.
Figure 2:
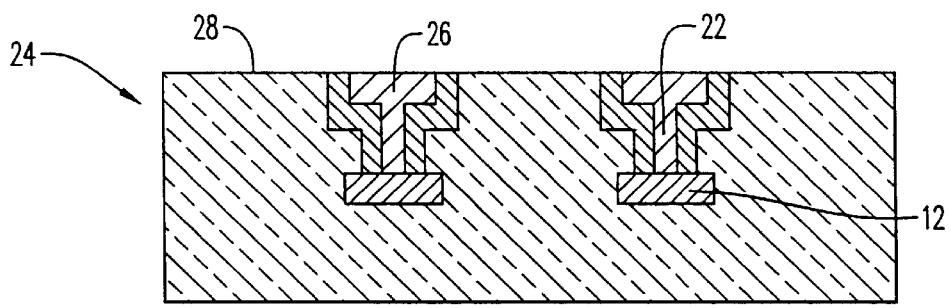
FIG. 2 illustrates in cross-sectional representation the substrate of FIG. 1 following chemical-mechanical polishing of the copper.
Figure 3:
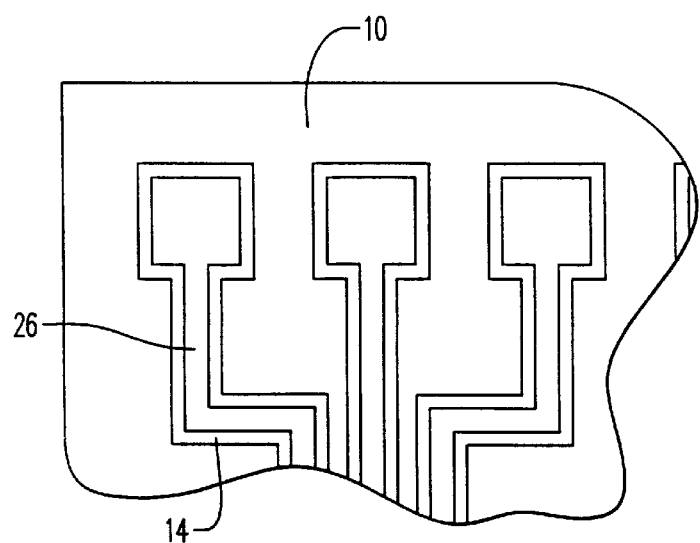
FIG. 3 illustrates the substrate of FIG. 1 in top planar view following chemical-mechanical polishing of the copper.

FIGS. 1 through 3 illustrate the formation of copper circuitry on a silicon based semiconductor device by the damascene process. Referring to FIG. 1, a silicon-based substrate 10 with a silicon dioxide layer formed on a silicon wafer by heating to a high temperature in an oxidizing atmosphere, contains a first metal layer 12. The first metal layer is typically copper vias formed by an earlier application of the damascene process. Conventional photolithography is then utilized to deposit an copper adhesion-promoting layer 14 on surfaces 16 of the silicon dioxide substrate 10. Titanium, tantalum and alloys thereof are suitable adhesion-promoting layers. As either a substitute for the adhesion-promoting layer 14 or as a second layer that overlies the adhesion promoting layer is a diffusion barrier layer 15. Suitable compounds for the diffusion barrier layer 15 include titanium, tantalum nitride, and tantalum silicon nitride.

An overlayer 18 of copper is deposited on the adhesion-promoting layer 14, including in trenches 20 and vias 22. The copper layer 18 is deposited by any suitable techniques such as electroless or electrolytic chemical deposition.

Chemical-mechanical polishing removes the overlayer 18 to produce the integrated circuit device portion 24, illustrated in FIG. 2, that has copper circuit traces 26 formed from the trenches (20 of FIG. 1) and, optionally, electrically interconnected to the first metal layer 12 through vias 22.

FIG. 3 illustrates a portion of a semiconductor device following chemical-mechanical polishing in top planar view. The circuit traces 26 are surrounded by the adhesion-promoting layer 14 and electrically isolated from each other by the silicon dioxide substrate 10.

Figure 4:
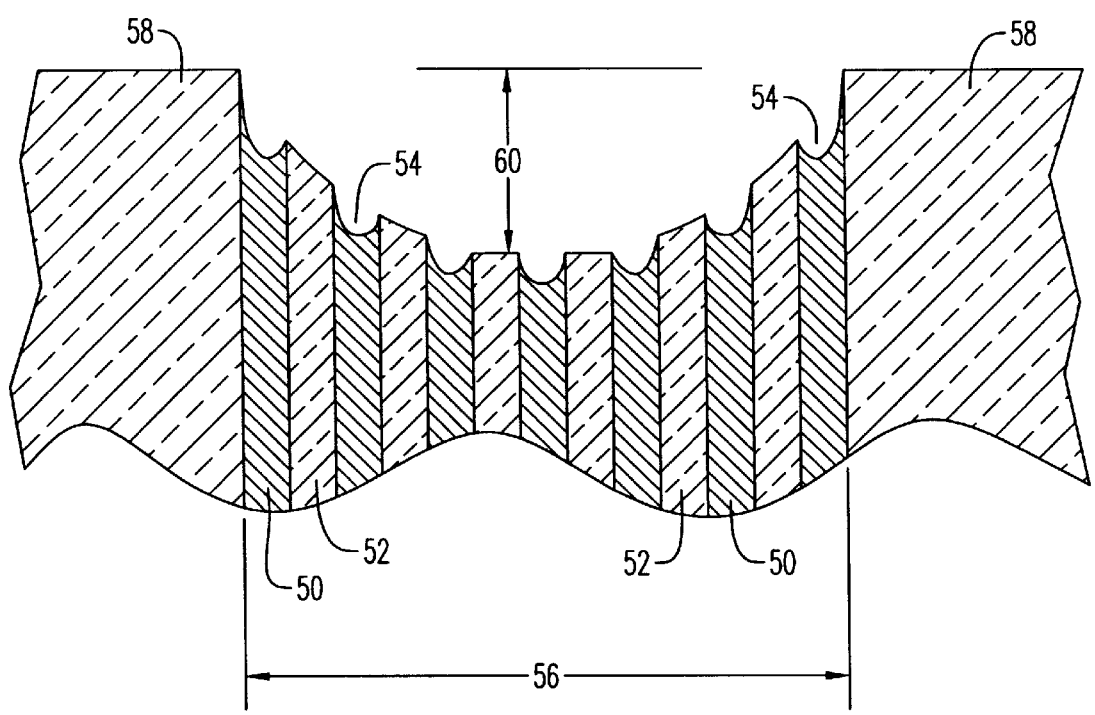
FIG. 4 illustrates a cross-sectional representation of a field of silicon oxide adjacent to a dense area of copper trenches showing erosion and dishing effects.

FIG. 4 represents a cross-sectional view of fields of silicon oxide adjacent to a dense area of copper trenches. This figure illustrates exaggerated erosion and dishing effects. The copper trenches 50 and oxide spacers 52 in the copper dense array 56 are surrounded by fields of silicon oxide 58. Erosion 60 is measured from the top of the field of silicon oxide 58 to the bottom of the array area 60. Dishing 54 of the copper trenches 50 is also illustrated by FIG. 4.

Among the requirements of a chemical-mechanical polishing method is that the top surface 28 of the semiconductor device portion 24 remain planar and the dishing caused by excess mechanical polishing should be minimized. There should also not be undercutting of the circuit traces 26 caused by dissolution of the copper by the chemical component. In addition, the amount of erosion or topography difference between a field of silicon dioxide oxide and a dense copper array should be less than 500 Å. Furthermore, the removal rate of the blanket copper should be greater than about 3000 Å/min in order to satisfy throughput demands. A method of polishing a copper-coated substrate that meets these demands is described as follows.

The CMP method of the present invention involves a two step process wherein the first step includes a bulk copper polishing step for increased throughput and a second step which utilizes a slurry that polishes the copper, the copper adhesion-promoting layer and the silicon based layers at the same rate. The use of the second slurry reduces the amount of dishing and erosion.

The two step copper polishing process comprising the steps of:

(i) providing a copper coated substrate, wherein said copper- coated substrate contains a copper adhesion-promoting layer and a silicon-based layer;

(ii) polishing the substrate with a first slurry capable of polishing the copper at a rate greater than 3000 Å/min, wherein said first slurry comprises an abrasive, a carboxylic acid and a oxidizer; and (iii) polishing the substrate with a second slurry such that the copper polishes at approximately the same rate as the adhesion layer and the silicon-based layer, wherein said second slurry comprises an abrasive, an acid and an oxidizer.

The first slurry is a bulk copper polishing slurry that rapidly removes the copper layer and imparts less defects to the substrate than comparable commercial slurries. The second slurry is a Cu/Ta/SiO2 slurry that removes the copper at approximately the same rate as the copper adhesion-promoting layer and the silicon-based layer. Preferably, the adhesion-promoting layer is a Tantalum-based layer such as tantalum (Ta), tantalum nitride (TaN) and tantalum-silicon-nitride (TaSiN) and the preferred silicon based layers are silicon oxide (SiO2) and silicon nitride (SiN). The more preferred copper adhesion-promoting layer is Ta and the more preferred silicon-based layer is SiO2.

Bulk Copper Polishing Slurry

The bulk copper polishing slurry comprises a first component, which is an abrasive phase, and a second component which is a liquid activator phase. The abrasive phase includes abrasive particles and typically a base so that the pH is approximate 9 to 12. Exemplary bases that are typically present in the abrasive phase are ammonium hydroxide, potassium hydroxide and sodium hydroxide. An example of a typical abrasive phase is a slurry made by Wacker Corporation K1020 with 20% fumed silica at a pH of 10. It is used for polishing silicon dioxide layers.

To prevent scratching or imparting other defects into the integrated circuit device, the particles have an average maximum diameter of about 800 nanometers. To facilitate polishing within a commercially viable period of time, the average maximum diameter is at least about 10 nanometers. Preferably, the average maximum diameter is from about 100 nanometers to about 300 nanometers.

For the purpose of this patent application, "particle" includes aggregates and other fused combinations of particles, as well as agglomerates and other solely mechanically interwoven combinations of particles. "Diameter" is intended to mean the distance from one edge of a particle to a diametrically opposed edge notwithstanding the shape of the particle. While a "primary particle" is intended to be a substantially spherical particle that is not bonded to other particles.

The abrasive particles may be any material that is harder than copper and the adhesion-promoting layer. A preferred material for the abrasive is a ceramic, such as alumina ($Al_2O_3$), fumed silica ($SiO_2$), ceria ($CeO_2$) and mixtures thereof. The more preferred abrasive particle is fumed silica.

Colloidal silica (solution grown) that has a primary particle diameter of from about 10 nanometers to about 100 nanometers is also suitable.

The liquid activator phase of the system is an aqueous solution that contains a carboxylic acid compound. In one embodiment, the carboxylic acid compound is a chemical compound having one or more carboxylate groups with hydroxl groups in the alpha position, such as straight chain mono- and dicarboxylic acids and salts, including, without limitation, lactic acid and lactates, malic acid and malates, tartaric acid and tartrates and gluconic acid and gluconates. Also effective are tri- and polycarboxylic acids and salts with secondary and tertiary hydroxyl groups in an alpha position relative to a carboxylic group, such as citric acid and citrates. Also effective are acid compounds containing a benzene ring (aromatic acids), including ortho di- and poly-hydroxybenzoic acids and acid salts, phthalic acid and acid salts, pyrocatecol, pyrogallol, gallic acid and gallates, tannic acids and tannates.

For the above described carboxylic acids, the preferred abrasive is fumed silica. Also, phthalic acid is preferred, most preferably in a concentration of from about 0.1 molar % to about 0.5 molar %.

A second embodiment includes an aliphatic, monobasic carboxylic acid, such as propanoic acid ($CH_3CH_2COOH$), methanoic (formic) acid (HCOOH), ethanoic (acetic) acid ($CH_3COOH$) and mixtures thereof. The preferred monobasic carboxylic acid is propanoic acid. The preferred abrasives for the monobasic carboxylic acids are alumina and fumed silica.

A second component of the liquid activator phase is an oxidizer. Any suitable oxidizer may be utilized, such as hydrogen peroxide, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, and mixtures thereof. The preferred oxidizers is hydrogen peroxide.

Optionally, a third component of the liquid activator phase may be used if one desires to increase the selectivity of tantalum and tantalum compounds relative to silicon dioxide. This third component is selected from the group consisting of fluoride-based compounds (including fluoride-based acids and fluoride-based acid salts) and bases. A "fluoride-based" compound is intended to convey a chemical composition that donates at least one fluoride ion ($F^-$) when exposed to a liquid media, that is typically an aqueous media. Exemplary fluoride-based acids include 0.1 to 50 percent, by weight, hydrofluoric acid, 0.1 to 20 weight percent of fluoroboric acid and 0.1 to 10 weight percent of fluorosilicic acid. Preferably, the content of the fluoride-based acid is from 0.5 weight percent to 8 weight percent.

Exemplary fluoride-based acid salts are 0.1 to 20 weight percent of ammonium fluoride and 0.1 to 20 weight percent of aluminum fluoride.

Preferably, the content of the fluoride-based acid salt is from 0.1 to 10 percent by weight, and most preferably, the content is from 0.5 to 5 percent by weight.

For highest tantalum selectivity, if desired, and minimum copper corrosion, ammonium fluoride is preferred as the third component.

Other additives to the liquid activator phase include surfactants, chelating agents and corrosion inhibitors. The surfactant compounds which may be used in the liquid activator phase are present in an amount of about 0.001 to 2 percent and preferably in the range of about 0.01 to 0.2 percent based on the total weight of the slurry. Suitable surfactant compounds include any of the numerous non-ionic, anionic, cationic or amphoteric surfactants known to those skilled in the art. Preferred surfactants are those that inhibit settling include a sodium polyacrylate solution, such as Rhone-Poulenc Colloid 207 or Rhone-Poulenc Colloid 284 (both available from Rhone-Poulenc of Marietta, Ga.). The surfactant is present in an amount of less than 1% and preferably in an amount of from about 0.3% to about 0.8%, based on the weight of the solids in the slurry.

Suitable chelating agents which may be added to the liquid activator phase activator such as ethylenediaminetetracetic acid (EDTA), N-hydroxyethylethylene- diaminetriacetic acid (NHEDTA), nitrilotriacetic acid (NTA), diethylklenetriaminepentacetic acid (DPTA), ethanoldiglycinate, and the like. The chelating agents may be present in an amount from about 100 ppm to about 10000 ppm based upon the total weight of the slurry.

Suitable corrosion inhibitors that may be added to the liquid activator phase include benzotriazole (BTA) and tolyl triazoles (TTA). The corrosion inhibitor is present in an amount from about 50 ppm to 10000 ppm of the total weight of the slurry.

The concentration of the constituents and pH of preferred bulk copper polishing slurries are shown below for an alumina abrasive slurry (Table 1) and a fumed silica abrasive slurry (Table 2).

TABLE 1

(Bulk copper polishing slurry with $Al_2O_3$ abrasive)

| CONSTITUENT | UNITS | BROAD RANGE | PRE-FERRED RANGE | MOST PREFERRED RANGE |
|---|---|---|---|---|
| Aliphatic Monobasic Carboxylic Acid | Molar | 0.3–1.5 | 0.5–1.0 | 0.8–1.1 |
| Oxidizer | Volume % | 3–15 | 5–10 | 6–8 |
| pH | — | 3–5 | 3.1–4.5 | 3.5–4.4 |
| Particle Type | — | $Al_2O_3$ | $Al_2O_3$ | $Al_2O_3$ |
| Particle Concentration | Weight % | 1–10 | 2–6 | 3–5 |

TABLE 2

(Bulk copper polishing slurry with $SiO_2$ abrasive)

| CONSTITUENT | UNITS | BROAD RANGE | PRE-FERRED RANGE | MOST PREFERRED RANGE |
|---|---|---|---|---|
| Carboxylic Acid | Molar | 0.05–1.5 | 0.05–1.0 | 0.08–1.1 |
| Oxidizer | Volume % | 0.5–15 | 1–10 | 1–7 |
| pH | — | 3–5 | 3.1–4.5 | 3.5–4.4 |
| Particle Type | — | $SiO_2$ | $SiO_2$ | $SiO_2$ |
| Particle Concentration | Weight % | 1–12 | 2–6 | 3–5 |

The bulk copper polishing slurry in Tables 1 and 2 achieves high copper polishing rates in the 8000–10000 Å/min range for the $Al_2O_3$ abrasive slurry and 3000 to 6000 Å/min range for the $SiO_2$ abrasive slurry. The preferred carboxylic acid for both slurries in Tables 1 and 2 above is propanoic acid and the preferred oxidizer is hydrogen peroxide.

Cu/Ta/$SiO_2$ Slurry

The Cu/Ta/$SiO_2$ slurry composition is useful for polishing copper, copper adhesion promoting layers and silicon-based layers at approximately equal polishing rates to prevent dishing and erosion of the copper in the trenches and vias. Preferably the adhesion-promoting layer is a tantalum-based layer such as tantalum (Ta), tantalum nitride (TaN) and tantalum-silicon-nitride (TaSiN) and the preferred silicon based layers are silicon oxide ($SiO_2$) and silicon nitride (SiN). The more preferred copper adhesion-promoting layer is Ta and the more preferred silicon-based layer is $SiO_2$.

The Cu/Ta/$SiO_2$ polishing slurry comprises a first component, which is an abrasive phase, and a second component, which is a liquid activator phase. The abrasive phase comprises the same bases and abrasive particles that are used in the bulk copper slurry composition described above except that the amount of abrasive in the Cu/Ta/$SiO_2$ slurry is at a higher concentration. The more preferred abrasive particle is fumed silica.

The liquid activator phase comprises an acid and an oxidizer. The Cu/Ta/$SiO_2$ slurry may include the same carboxylic acid compounds used in the bulk copper polishing slurry described above. In addition, inorganic acids may also be used such as hydrochloric acid, nitric acid, phosphoric acid, sulfuric acid, hydrofluoric acid, and mixtures thereof. The preferred inorganic acid is nitric acid. The inorganic acid should be added in sufficient amounts for the slurry to have a pH of from about 9 to 11.

Any suitable oxidizer may be used in the Cu/Ta/$SiO_2$ slurry such as the ones described above for the bulk copper slurry. In addition, the Cu/Ta/$SiO_2$ slurry may further comprises optional additions including surfactants, chelating agents and corrosion inhibitors. The same surfactant, chelating agents and corrosion inhibitors used in the bulk copper slurry may also be used in this slurry.

The main difference between the bulk slurry and the Cu/Ta/$SiO_2$ slurry is the concentration of the constituents and the pH. The concentration of the acid and oxidizer is higher and the concentration of the abrasive is much lower in the bulk copper polishing slurry than the Cu/Ta/$SiO_2$ slurry. In addition, the pH of the Cu/Ta/$SiO_2$ slurry is much higher than the bulk slurry.

In a preferred embodiment, the concentration and pH of the Cu/Ta/$SiO_2$ slurry is shown below in Table 3.

TABLE 3

(Cu/Ta/$SiO_2$ slurry)

| CONSTITUENT | UNITS | BROAD RANGE | PREFERRED RANGE |
|---|---|---|---|
| Carboxylic Acid | Molar | 0.01–0.2 | 0.25–0.1 |
| Oxidizer | Volume % | 0.05–0.5 | 0.1–0.3 |
| PH | — | 9–11 | 9–11 |
| Particle Type | — | $Al_2O_3$ or $SiO_2$ | $Al_2O_3$ or $SiO_2$ |
| Particle Concentration | Weight % | 15–30 | 18–25 |

The inventors have discovered that when the bulk copper slurry is used as the first slurry and the Cu/Ta/$SiO_2$ polishing slurry is used as the second slurry in the copper polishing method described above, the process achieves many, if not most of the requirements for CMP copper polishing. The achievements includes high copper removal rates and minimal dishing and erosion

EXAMPLE 1

Bulk Copper Polishing Slurry with Alumina

A number of slurries of abrasive particles in an aqueous liquid activator phase were formed for bulk copper polishing having:

propanoic acid concentration of between 0.5 and 1.0 molar;

hydrogen peroxide concentration of between 5 and 10 volume percent;

a pH of between 3.1 and 4.5; and abrasive alumina particles in a concentration of between 3 and 10 weight percent.

The abrasive alumina particles had a mean particle diameter of 550 nanometers, a median particle diameter of 540 nanometers and a maximum particle diameter of 800 nanometers.

The particles were dispersed in the liquid activator phase using a Ross high shear laboratory mixer (manufactured by Charles Ross & Sons Co. of Happauge, N.Y.). After the particles were dispersed, the pH was adjusted with ammonium hydroxide, and the hydrogen peroxide oxidizer was then added.

Copper alloy C102 (nominal composition, by weight, 99.95% copper minimum) wafers, three inches in diameter, were used to simulate a silicon wafer with copper deposited on a dielectric layer. The polishing was done on a Struers RotoPol 31 machine with a RotoForce-3 pressure unit (both manufactured by Struers of Westlake, Ohio). Polishing was done at a rotation speed of 150 revolutions per minute for both the contact pad and for the wafer, giving a calculated relative velocity of the contact pad and the wafer of 232 feet per minute. The polishing time for each run was 30 seconds. The polishing pad was a Rodel CR IC1000-A3 perforated pad (manufactured by Rodel, Inc. of Newark, Del.) and the wafer was held in a Rodel NTA, DF200 template.

The polishing force was fixed at 120 Newtons, corresponding to a pressure of 3.81 psi. The slurry flow rate was fixed at 40 milliliters per minute and the removal rate determined by weighing the wafer before and after polishing. The polished wafer was also visually examined at magnifications of up to 1000X.

Analysis of the experimental results using commercial Design of Experiments software showed that all of the objectives were met with a slurry containing 3 to 5 weight percent of alumina particles, a propanoic acid concentration of 0.75 to 1.0 molar, a hydrogen peroxide concentration of 6 to 8 volume percent and a pH range of 3.1 to 3.7 with the ammonium hydroxide concentration range that is required to achieve the specified pH. This slurry had a mean particle of 550 nanometers, a median particle size of 540 nanometers and a maximum particle size of 800 nanometers. The removal rate achieved with this range of slurry parameters was 800–1000 nanometers per minute. This is higher than commercially available slurries that have a typical removal rate of between 750 nanometers per minute and 950 nanometers per minute.

For the same slurry composition range, the static etch rate of copper was 11.3 nanometers per minute, lower than the chemical-mechanical polishing rate of copper by a factor of from about 70 to about 90.

EXAMPLE 2

Bulk Copper Polishing Slurry with Silica

A bulk copper polishing slurry with silica was formulated with 4 wt. % silica, a propanoic acid concentration of 0.08M, a hydrogen peroxide concentration of 1 volume %, a benzotriazole concentration of 0.012 wt. % and a pH of 4.3. The slurry had a mean particle size of 200 nm. The same polishing conditions were used as in example 1. Using this slurry, the copper removal rate was 3500 Å/min and the passive etch removal rate was 30 Å/min

EXAMPLE 3

$Cu/Ta/SiO_2$ Slurry

An aqueous slurry mixture consisting of 0.05 M propanoic acid, 0.2% $H_2O_2$ and 20% by weight fumed silica at pH of 10.0 was prepared and used to polish copper/tantalum/silicon oxide layers on a 200 mm diameter silicon wafer. The polish was performed on a IPEC Westec 472 and the process conditions were 5 psi downforce, 120 ft/min relative velocity and 200 ml/min slurry flow rate. This slurry yielded average removal rates of 143.5 nm/min for copper, 85.4 nm/min for tantalum and 146.2 for silicon dioxide. Although the removal rate was not exactly equal for all three layers, subsequent polishing of pattern wafers with copper vias and trenches with the this slurry resulted in less dishing than commercially available slurries. The maximum dishing produced by the $Cu/Ta/SiO_2$ slurry is typically less than 40 nm. Typical commercial copper slurries can produce dishing as high as 150 nm.

The erosion of silica in a 0.5 $\mu$m copper array with a 1.0 $\mu$m pitch was typically less than 400 Å.

It is apparent that there has been provided in accordance with the present invention a chemical-mechanical polishing system that fully satisfies the objects, means and advantages set forth above. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A slurry for the chemical-mechanical polishing of a copper coated substrate, said slurry comprising:
   an abrasive phase comprising abrasive particles; and
   a liquid activator phase contacting said abrasive phase, said liquid activator phase being an aqueous solution that comprises a mixture of a carboxylic acid and an oxidizer.

2. The slurry of claim 1 wherein said abrasive particles are at least one compound selected from the group consisting of: alumina, silica, ceria and mixtures thereof.

3. The slurry of claim 1 wherein said abrasive particles are silica and wherein said carboxylic acid is at least one acid selected from the group consisting of: one or more carboxylate groups with hydroxyl groups in the alpha position, tri and poly carboxylic acid and salts with secondary and tertiary hydroxyl groups in an alpha position relative to a carboxylic group, and aromatic acids.

4. The slurry of claim 1 wherein said carboxylic acid is an aliphatic monobasic carboxylic acid.

5. The slurry of claim 3, wherein said carboxylic acid is at least one acid selected from the group consisting of: lactic and lactates, malic acid and malates, tartaric acid and tartrates, gluconic acid and gluconates, citric acid and citrates, phthalic acid and phthalates, pyrocatecol, pyrogallol, gallic acid and gallates, tannic acid and tannates, and ortho, di- and polyhydroxybenzoic acid and its salts.

6. The slurry of claim 1, wherein said oxidizer is at least one selected from the group consisting of: hydrogen peroxide, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, and mixtures thereof.

7. The slurry of claim 1 wherein said oxidizer is hydrogen peroxide and said carboxylic acid is at least one acid selected from the group consisting of: formic acid, acetic acid, propanoic acid and mixtures thereof.

8. The slurry of claim 1, wherein said carboxylic acid is an aliphatic monobasic carboxylic acid in the amount of 0.5 to 1.0 molar %, the amount of said oxidizer is about 5 to 10 volume % of the total slurry composition, said abrasive particles are alumina in the amount between about 2 to 6 weight percent of the total slurry composition, and the pH of the slurry is between about 3.1 to 4.5.

9. The slurry of claim 1, wherein said carboxylic acid is present in an amount between about 0.05 to 1.0 molar %, the amount of said oxidizer is about 1 to 10 volume % of the total slurry composition, said abrasive particles are silica which are present in an amount between about 2 to 6 weight percent of the total slurry composition, and the pH of the slurry is between about 3.1 to 4.5.

10. The slurry of claim 1 further comprising a fluorine-containing compound which is present in an amount between about 0.1% to 10 percent by weight of the total slurry composition and selected from the group consisting of: ammonium fluoride, aluminum fluoride and mixtures thereof.

11. The slurry of claim 1 further comprising at least one additional additive, said additional additive being selected from the group consisting of: chelating agents, corrosion inhibitors and surfactants.

12. A slurry for the chemical-mechanical polishing of a copper coated substrate, said slurry comprising:

an abrasive phase comprising abrasive particles; and a liquid activator phase contacting said abrasive phase, said liquid activator phase being an aqueous solution that includes a mixture of an acid and an oxidizer.

13. The slurry of claim 12 wherein said abrasive particles are selected from the group consisting of: alumina, silica, ceria and mixtures thereof.

14. The slurry of claim 12 wherein said acid is at least one acid selected from the group consisting of: formic acid, acetic acid, propanoic acid, nitric acid and mixtures thereof.

15. The slurry of claim 12 wherein said acid is at least one acid selected from the group consisting of: lactic acid and lactates, malic acid and malates, tartaric acid and tartrates, gluconic acid and gluconates, citric acid and citrates, phthalic acid and phthalates, pyrocatecol, pyrogallol, gallic acid and gallates, tannic acid and tannates, and ortho, di- and polyhydroxybenzoic acid and its salts.

16. The slurry of claim 12 wherein said oxidizer is selected from the group consisting of: hydrogen peroxide, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, and mixtures thereof.

17. The slurry of claim 12 wherein said oxidizer is hydrogen peroxide.

18. The slurry of claim 12, wherein said acid is a carboxylic acid, and wherein said carboxylic acid is present in an amount between about 0.025 to 0.1 molar %, said oxidizer is present in an amount between about 0.1 to 0.3 volume % of the total slurry composition, said abrasive is between about 18 to 25 weight percent of the total slurry composition, and the pH of the slurry is about 9 to 11.

19. The slurry of claim 12 further comprising at least one additional additive, said additional additive is selected from the group consisting of:

chelating agents, corrosion inhibitors and surfactants.

20. A process for polishing a copper coated substrate to prevent dishing comprising the steps of:

(i) providing a copper coated substrate, wherein said copper coated substrate contains a copper adhesion-promoting layer and a silicon-based layer;

(ii) polishing said substrate with a first slurry capable of polishing the copper at a rate greater than 3000 Å/min, wherein said first slurry comprises an abrasive, a carboxylic acid and a oxidizer; and (iii) polishing said substrate with a second slurry such that the copper polishes at approximately the same rate as the copper adhesion-promoting layer and the silicon-based layer, wherein said second slurry comprises an abrasive, an acid and an oxidizer.

21. The process of claim 20 wherein said carboxylic acid in said first slurry is an aliphatic monobasic carboxylic acid which is present in an amount between about 0.5 to 1.0 molar %, said oxidizer in said first slurry is present in an amount between about 5 to 10 volume % of the total slurry composition, said abrasive particles in said first slurry are alumina are present in an amount between about 2 to 6 weight percent of the total slurry composition, and the pH of said first slurry is about 3.1 to 4.5.

22. The process of claim 20 wherein said carboxylic acid in said first slurry is in the amount between about 0.05 to 1.0 molar %, said oxidizer in said first slurry is present in an amount between about 1 to 10 volume % of the total slurry composition, said abrasive in said first slurry is silica and is present in an amount of between about 2 to 6 weight percent of the total slurry composition, and the pH of said first slurry is about 3.1 to 4.5.

23. The process of claim 20 wherein the acid in said second slurry is a carboxylic acid and the amount of said carboxylic acid in said second slurry is present in an amount between about 0.025 to 0.1 molar %, said oxidizer in said second slurry is present in an amount between about 0.1 to 0.3 volume % of the total slurry composition, said abrasive in said second slurry is present in an amount between about 18 to 25 weight percent of the total slurry composition, and the pH of said second slurry is about 9 to 11.

24. The process of claim 22 wherein said carboxylic acid is at least one acid selected from the group consisting of: formic acid, acetic acid, propanoic acid and mixtures thereof, and wherein said oxidizer is hydrogen peroxide.

25. The process of claim 21 wherein said carboxylic acid is at least one acid selected from the group consisting of: formic acid, acetic acid, propanoic acid and mixtures thereof, and wherein said oxidizer is hydrogen peroxide.

26. The process of claim 20 wherein said copper adhesion-promoting layer is tantalum and wherein said silicon-based layer is silicon dioxide.

27. The process of claim 20 further comprising at least one additional additive selected from the group consisting of: chelating agents, corrosion inhibitors and surfactants.

28. The process of claim 20 wherein said abrasive in said first slurry is silica and the abrasive in said second slurry is silica.

* * * * *